United States Patent [19]

Shiomi

[11] Patent Number: 5,175,580
[45] Date of Patent: Dec. 29, 1992

[54] CAMERA WITH IMAGE STABILIZING DEVICE

[75] Inventor: Yasuhiko Shiomi, Kawaguchi, Japan

[73] Assignee: Canon Kabushiki Kaisha, Tokyo, Japan

[21] Appl. No.: 743,033

[22] Filed: Aug. 9, 1991

[30] Foreign Application Priority Data

Aug. 14, 1990 [JP] Japan ................................ 2-214634

[51] Int. Cl.$^5$ .............................................. G03B 5/00
[52] U.S. Cl. ................................... 354/410; 354/430; 354/484
[58] Field of Search ................. 354/410, 407, 430, 70, 354/65, 484

[56] References Cited

U.S. PATENT DOCUMENTS

| 4,780,739 | 10/1988 | Kawakami et al. | 354/430 |
| 4,965,619 | 10/1990 | Shikaumi et al. | 354/410 |
| 5,012,270 | 4/1991 | Sekine et al. | 354/430 |
| 5,084,724 | 1/1992 | Maeno | 354/430 |
| 5,095,198 | 3/1992 | Nakazawa et al. | 354/407 |

Primary Examiner—Russell E. Adams
Attorney, Agent, or Firm—Fitzpatrick, Cella, Harper & Scinto

[57] ABSTRACT

A camera with an image stabilizing device comprises includes a power supply for the camera, image stabilizing means for preventing image blur of the camera, discrimination means for discriminating a status of the power supply, and control means for varying a manner of discrimination by the discrimination means in accordance with the status of the image stabilizing means.

36 Claims, 6 Drawing Sheets

| FIG.1A | FIG.1B |

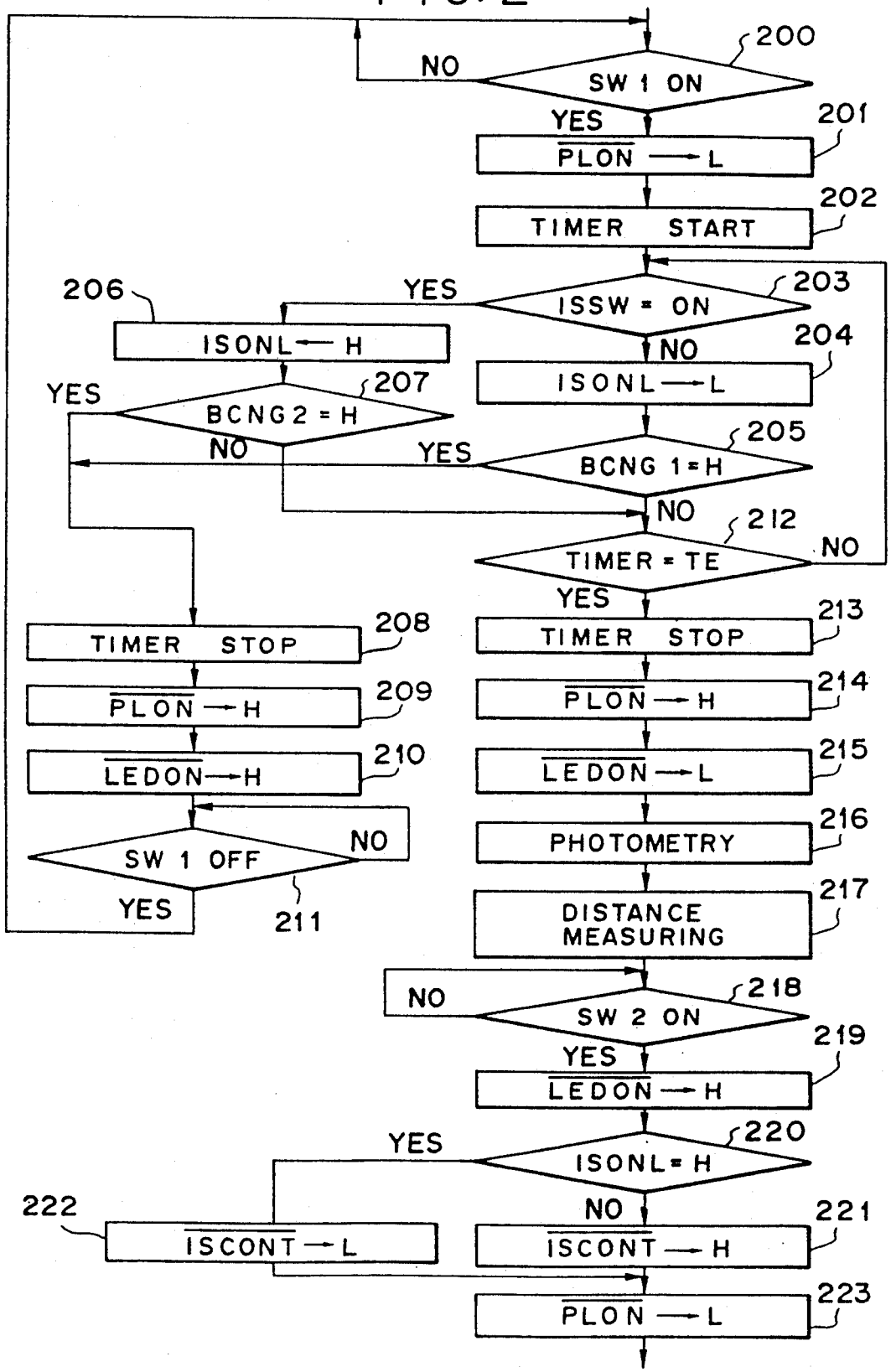

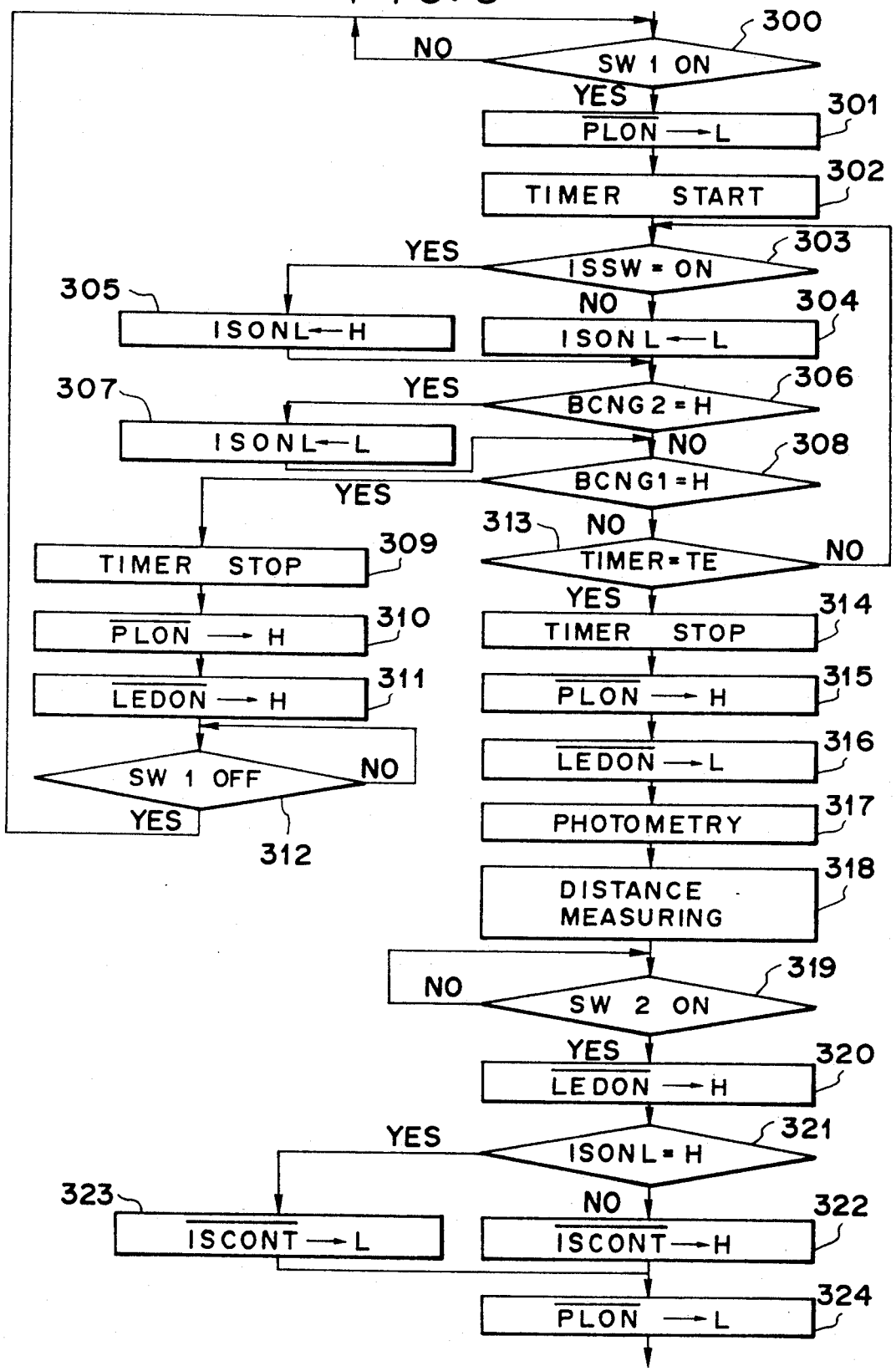

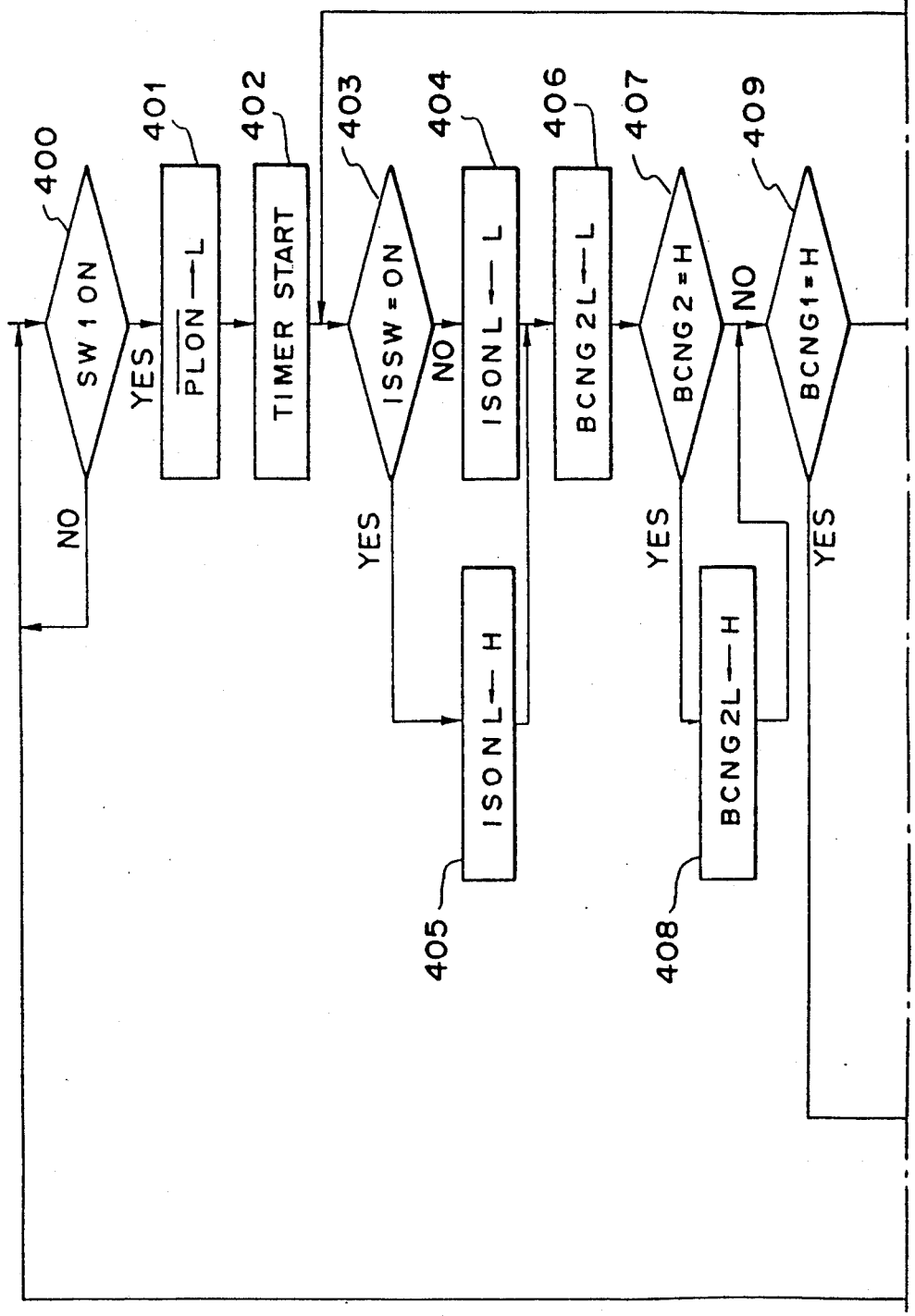

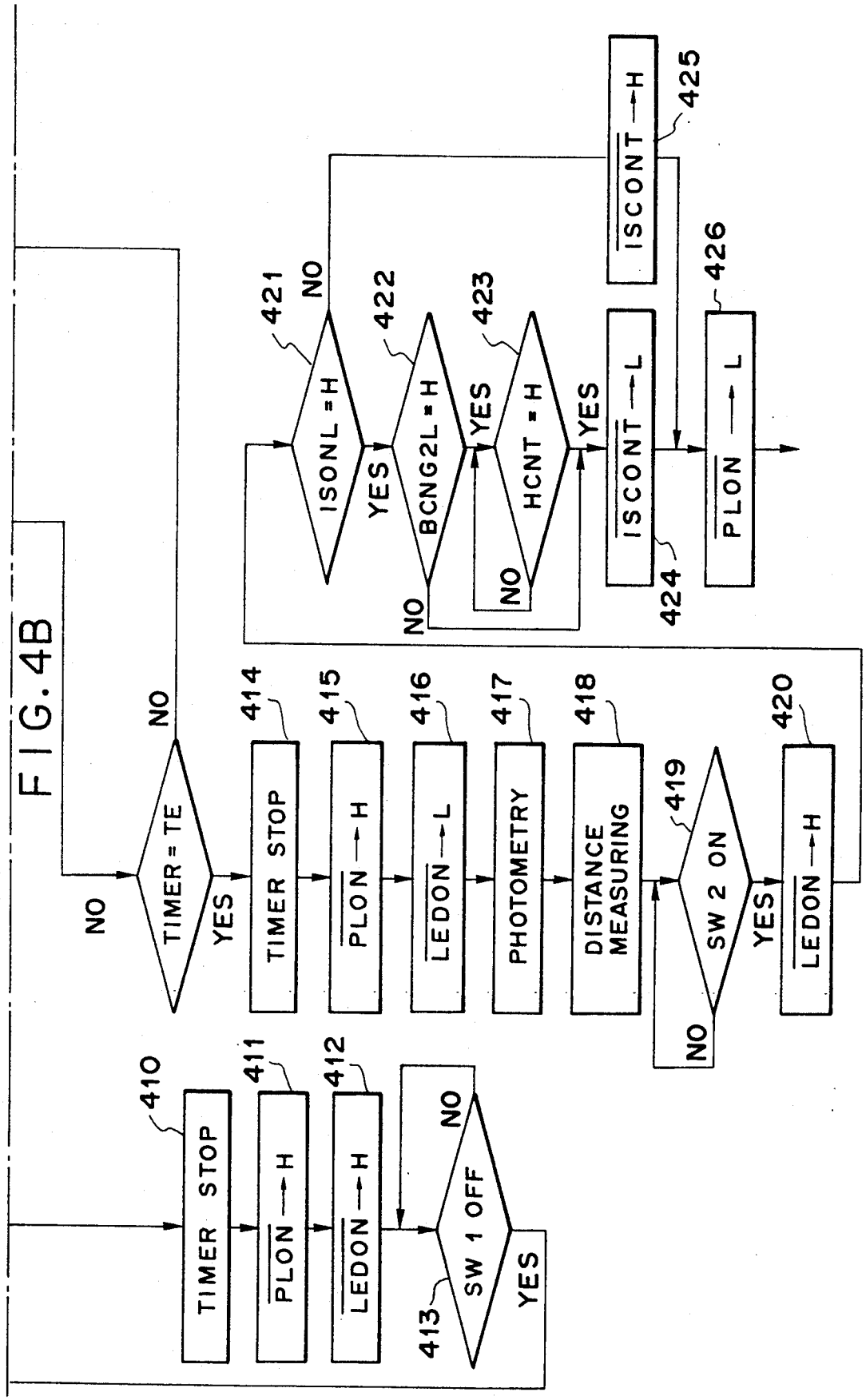

CAMERA WITH IMAGE STABILIZING DEVICE

BACKGROUND OF THE INVENTION

1. Field of the Invention

The present invention relates to an improvement in a camera with an image stabilizing device which prevents image blur due to vibration of a hand of a photographer.

2. Related Background Art

In a prior art camera with an image stabilizing device, a swing displacement detection means for detecting an angular displacement relative to an absolute space as a swing displacement of the camera, and a correcting optical system, is driven in accordance with an output of the swing detection means in order to correct the image blur thus aiding an imaging optical system. The correcting optical system may use a variable vertical angle prism which utilizes a refractive index of liquid as disclosed in Japanese Laid-Open Patent Application No. 2-59718. It supplies a current which is proportional to the output of the swing detection means to a driving voice coil of the variable vertical angle prism. (In actuality, a feedback control is effected to make the output of the swing detection means and an angular displacement output of the variable vertical angle prism equal to each other.)

Accordingly, in the actual control of the camera, the energization of the voice coil is usually started before a shutter is opened, and the voice coil is deenergized a predetermined period of time after the closure of the shutter.

However, in the above prior art camera, since the shutter driving coil of the camera and the voice coil for driving the correcting optical system are simultaneously energized, if a voltage of a battery cell mounted in the camera drops, the operation may be assured by a normal battery check but the correct opening operation of the shutter may not be assured because the actual supply current is very large due to the fact that the current to drive the correcting optical system is additionally required during the shutter opening operation.

On the other hand, if the battery check level is set to a higher level to assure the energizations to both the shutter driving coil and the voice coil for the correcting optical system, the number of frames to be photographed is very much reduced compared with a normal case.

SUMMARY OF THE INVENTION

In drawbacks above of the above, drawbacks it is an object of the present invention to provide a camera with an image stabilizing device which comprises a power supply for the camera, image stabilizing means energized by the power supply for stabilizing an image of the camera, discrimination means for discriminating a status of the power supply, and control means for changing a manner of discrimination by the discrimination means in accordance with a status of the image stabilizing means so that an optimum control is attained depending on a photographing status.

Other objects of the present invention will become apparent from the following description of the preferred embodiments.

BRIEF DESCRIPTION OF THE DRAWINGS

FIG. 2 shows a flow chart of an operation of the embodiment, FIG. 3 shows a flow chart of another operation of the embodiment, and FIG. 4 shows a flow chart of a further operation of the embodiment.

DETAILED DESCRIPTION OF THE PREFERRED EMBODIMENTS

The embodiment of the present invention is now explained in detail with reference to the drawings.

Figures 1, 1A:
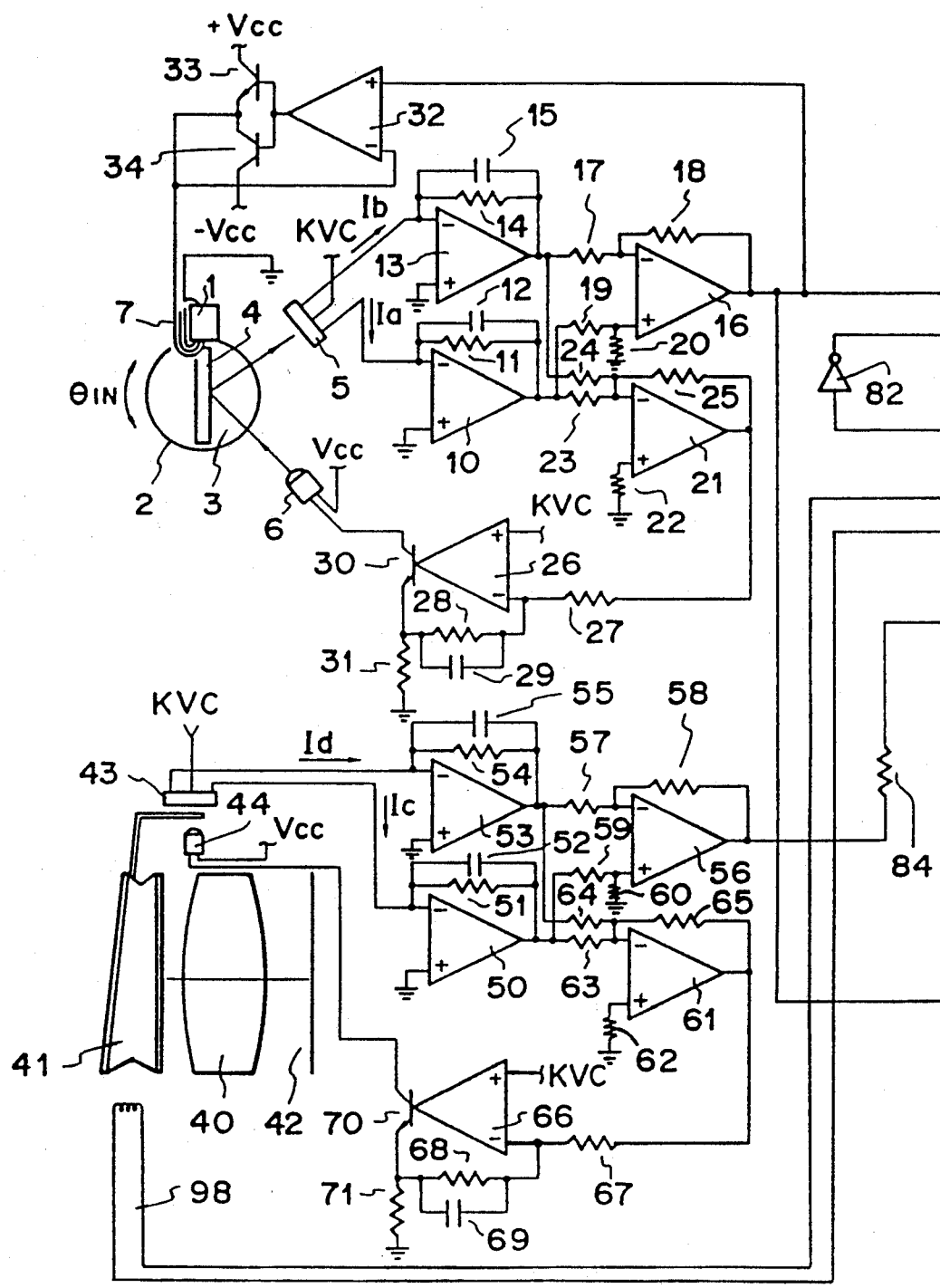
FIG. 1 shows a configuration of a camera with an image stabilizer in accordance with an embodiment of the present invention.
Figure 1B:
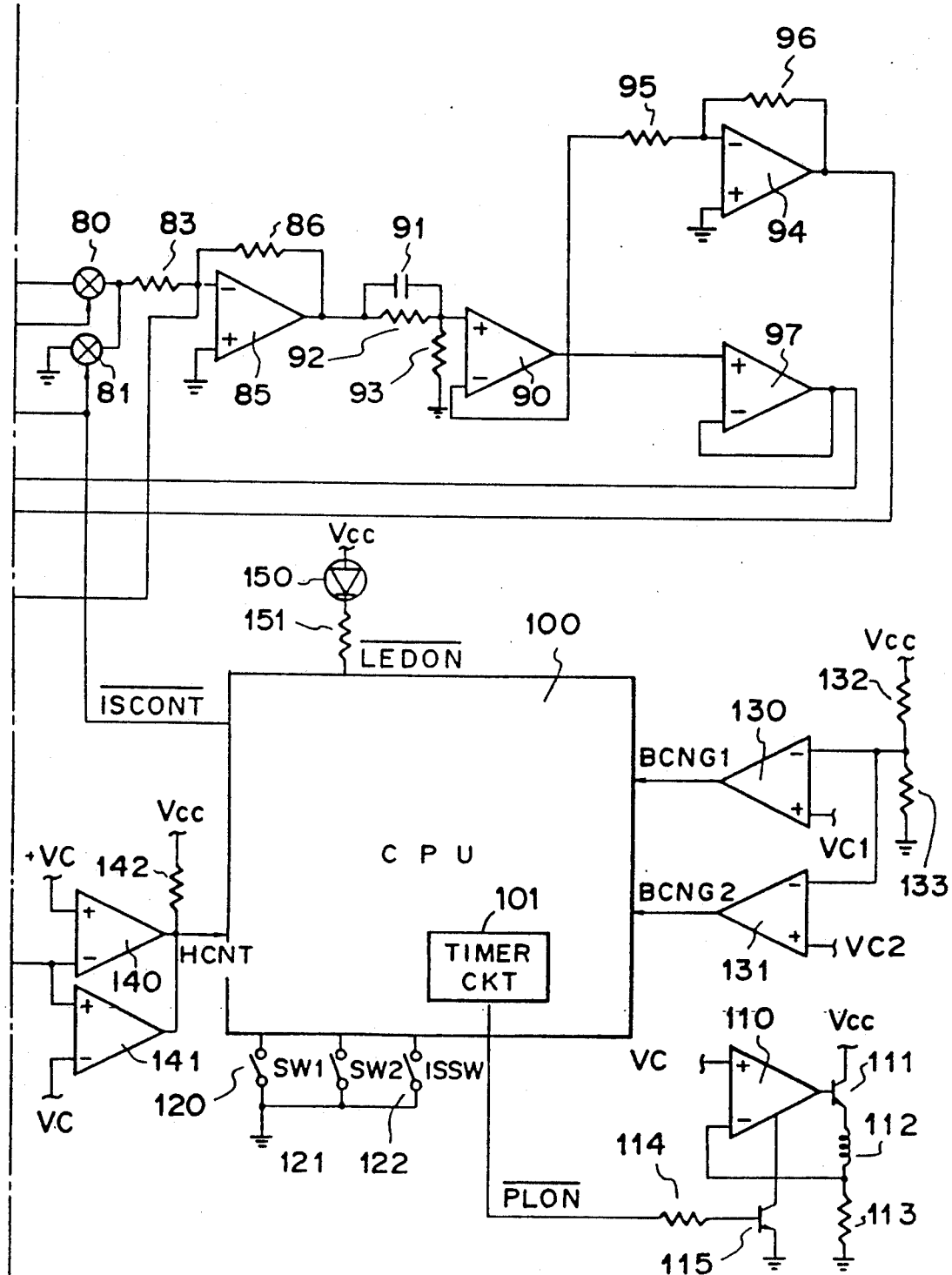

FIG. 1 shows a configuration of a camera with an image stabilizer in accordance with an embodiment of the present invention, and FIG. 2 shows a flow chart of an operation of the embodiment.

In FIG. 1, liquid 3 is filled in a cylindrical outer tube 2 and a float 4, having a magnetic characteristic which is rotatable around a predetermined rotation axis, is mounted in the liquid 3. A winding coil 7 is provided as shown between the float 4 and a yoke 1 which forms a closed magnetic circuit.

Assuming that the outer tube 2 which moves with the camera, is rotated by $\theta_{IN}$ relative to an absolute space due to hand vibration, the float 4 therein is kept stationary relative to relative absolute space due to relative an inertia of the liquid 3 so that the float 4 rotates relative to the outer tube 2. The relative displacement (swing displacement) is detected by optical detection means which uses a light emitting device 6 and a photo-sensing device 5 which move with the camera.

Specifically a signal light emitted by the light emitting device 6 is reflected by the surface of the float 4 and directed to the position detecting photo-sensing device 5. As a result, if the float 4 rotates relative to the outer tube 2, an incident position of the reflected signal light to the photo-sensing device 5 changes so that output currents Ia and Ib of the photo-sensing device 5 change with the movement of the float 4. The output currents Ia and Ib are amplified by a current-voltage converter which comprises an operational amplifier 10, a resistor 11 and a capacitor 12, and a current-voltage converter which comprises an operational amplifier 13, a resistor 14 and a capacitor 15, and the respective outputs are applied to an adder which comprises an operational amplifier 21 and resistors 22, 23, 24 and 25, and a subtractor which comprises an operational amplifier 16 and resistors 17, 18, 19 and 20. An output of the adder is applied to an iRED driver which comprises an operational amplifier 26, resistors 27, 28 and 31, a capacitor 29 and a transistor 30. A feedback control is effected to keep the output of the adder equal to a reference potential KVC.

On the other hand, an angular displacement of a variable vertical angle prism 41, used in a correcting optical system, is also detected by position detection means in the same manner as that of the swing displacement detection means. Namely, a slit which is linked to the movement of the variable vertical angle prism 41 is provided between a light emitting device 44 and a photo-sensing device 43, and photo-currents Ic and Id are produced by the photo-sensing device 43 as the slit moves The photo-currents Ic and Id are respectively by a current-voltage converter which comprises an operational amplifier 50, a resistor 51 and a capacitor 52, and a current-voltage converter which comprises an operational amplifier 53, a resistor 54 and a capacitor 55, and the respective outputs are applied to a subtractor which comprises an operational amplifier 56 and resistors 57, 58, 59 and 60 and an adder which comprises an operational amplifier 61 and resistors 62, 63, 64 and 65. An output of the adder is applied to an iRED driver which comprises an operational amplifier 66, resistors 67, 68 and 71, a capacitor 69 and a transistor 70 so that the output of the adder is always kept equal to the reference potential KVC.

The outputs of the substractors represent a swing displacement relative to an absolute space and an angular displacement of the variable vertical angle prism 41, respectively.

The output of the operational amplifier 16 is applied to a coil driver which comprises an operational amplifier 32 and transistors 33 and 34 so that an energization current to the coil 7 is determined in accordance with the output of the operational amplifier 16. As described above, when a current is supplied to the coil 7 positioned in the closed magnetic circuit which comprises the yoke 1 and the float 4, a force due to the Flemmings left hand law is created. Thus, the movement of the angular displacement sensor (outer tube 2, liquid 3 and float 4) and a characteristic thereof can be controlled by controlling the current.

The output of the operational amplifier 16 is supplied to a resistor 83 through an analog switch 80, and the output of the operational amplifier 56 is supplied to a resistor 84, and those resistors are connected to an inverting input terminal of an operational amplifier 85 having a feedback resistor 86 connected thereto. The output of the operational amplifier 85 is applied to a phase compensation circuit which comprises an operational amplifier 90, resistors 92 and 93 and a capacitor 91 to effect the phase compensation of an overall feedback system.

The output thereof is applied to a power amplifier which comprises an operational amplifier 97 and an inverting power amplifier which comprises an operational amplifier 94 and resistors 95 and 96. The energization of the voice coil 98 is controlled by the outputs of those two operational amplifiers.

Thus, the feedback control is effected such that the output of the angular displacement sensor (swing displacement detection means) and the angular displacement output of the variable vertical angle prism 41 (position detection means) are equal. By setting the gain such that a correction angle per unit angle of the variable vertical angle prism 41 and a swing angle per unit angle of the angular displacement sensor are equal to each other, an object image on an image plane of the camera is kept static by the operation of the correcting optical system even if the camera is moved relative to an absolute space by the hand vibration.

Numeral 101 denotes a timer circuit in a CPU 100 and a constant current circuit, which comprises an operational amplifier 110, a transistor 111 and a resistor 113, supplies a current to a coil 112 which drives the shutter of the camera. The constant current circuit is activated and deactivated by an output $\overline{\text{PLON}}$ from the CPU 100 through a resistor 114 and a transistor 115. A switch 120 (SW1) is turned on by a first stroke of a release button of the camera, a switch 121 (SW2) is turned on by a second stroke and a switch 122 (ISSW) selects the image stabilizing operation by the variable vertical angle prism 41.

Resistors 132 and 133 divide a power supply voltage Vcc of the camera (which drives all components shown in FIG. 1) at a predetermined ratio. A potential at the junction of the resistors is supplied to inverting input terminals of comparators 130 and 131. A reference potential VC1 is applied to a non-inverting input terminal of the comparator 130, and a potential VC2 which is higher than the reference potential VC1 is applied to a non-inverting input terminal of the comparator 131, and the respective outputs are supplied to the CPU 100 as BCNG1 and BCNG2.

Comparators 140 and 141 and a resistor 142 form a window comparator which determines whether the output of the swing displacement detection means (the output of the operational amplifier 16) is between the reference potentials $+VC$ and $-VC$, and supplies a discrimination result to the CPU 100 as an output HCNT. An LED 150 and a resistor 151 are turned on and off by a signal $\overline{\text{LEDON}}$ from the CPU 100.

An operation is now explained with reference to a flow chart of FIG. 2.

In a step 200, whether the switch SW1 of the camera is on or not is determined, and if it is on, the process proceeds to a step 201 where the output $\overline{\text{PLON}}$ of the CPU 100 is rendered to an L level to start the energization to the coil 112 which is used for controlling the shutter. In a step 202, the timer circuit 101 in the CPU 100 is started. In a step 203, the status of the switch 122 (ISSW) which selects the image stabilizing operation is checked. If it is on, the process proceeds to a step 206, and if it is off, the process proceeds to a step 204. In the step 206, ISONL which stores the status of the switch ISSW is set to an H level. In a step 207, the status of the output BCNG2 of the comparator 131 is checked. If it is at the H level, the decision is made that the divided level of the power supply voltage Vcc is lower than the reference potential VC2 and the process proceeds to a step 208. If the output BCNG2 is at the L level, the decision is made that the power supply voltage Vcc is higher than the reference potential VC2 and the process proceeds to a step 212.

On the other hand, in the step 204, ISONL is set to the L level, and in a step 205, the status of the output BCNG1 of the comparator 130 is checked. If it is at the H level, the decision is made that the divided level of the power supply voltage Vcc is lower than the reference potential VC1 and the process proceeds to a step 208. When the output BCNG1 is at the L level, the process proceeds to a step 212.

Steps through 211 relate to a control step used when the power supply voltage of the camera does not satisfy a predetermined voltage level. In a step 208, the timer circuit 101 is stopped. In a step 209, the output $\overline{\text{PLON}}$ is rendered to the H level to stop the energization to the coil 112. In a step 210, the output $\overline{\text{LEDON}}$ is rendered to the H level to extinguish the LED 150. In a step 211, the process stands by until the switch SW1 turns off, when the process returns to the step 200.

In a step 212, whether the count of the timer circuit 101 has reached a predetermined count TE or not is determined. If it has not been reached, the process returns to the step 203 to repeat the above operation. If it has been reached, the timer circuit 101 is stopped in a step 213, and the output $\overline{\text{PLON}}$ is rendered to the H level in a step 214 to stop the energization to the coil 112. In a step 215, the output $\overline{\text{LEDON}}$ is rendered to the L level to turn on the LED 150. In a step 216, a brilliance status of the object is measured by a photometer circuit (not shown). In a step 217, a distance to the object is measured by a ranging circuit (not shown). In a step 218, the status of the switch 121 (SW2) which corresponds to a release start button of the camera is checked. If the switch SW2 is on, the process immediately proceeds to a step 219 where the output $\overline{\text{LEDON}}$ is rendered to the H level to turn off the LED 150. In a step 220, the status of the ISONL is checked. If the ISONL is at the H level, the output $\overline{\text{ISCONT}}$ is rendered to the L level in a step 222 so that the analog switch 80 is turned on and the analog switch 81 is turned off, and the operation of the variable vertical angle prism 41 is started in accordance with the output of the angular displacement sensor (the swing displacement detection means) to stabilize the image.

On the other hand, when the ISONL is at the L level, the process proceeds to a step 211 to render the output $\overline{\text{ISCONT}}$ to the H level so that the analog switch 80 is turned off and the analog switch 81 is turned on, and the image stabilizing operation is not effected. In a step 223, the output $\overline{\text{PLON}}$ is rendered to the L level to start the drive of the body tube and the opening of the shutter.

In the first embodiment, the battery check level (VC1 or VC2) is changed depending on the status of the selection switch ISSW which selects the image stabilizing operation.

FIG. 3 shows a flow chart of a second embodiment of the operation of FIG. 1.

Steps 300 to 305 are identical to the steps 200 to 204 and 206 in the first embodiment. In a step 306, the status of the output BCNG2 of the operational amplifier 131 is checked. If it is at the H level, the process proceeds to a step 307 where the flag ISONL which stores the status of the switch ISSW is forcibly rendered to the L level. In a step 308, the status of the output BCNG1 of the operational amplifier 130 is checked. If it is at the H level, the identical operation as that in the steps 208 to 211 of the first embodiment is carried out in steps 309 to 312 to conduct a process for the battery check NG.

Steps 313 to 324 are identical to the steps 212 to 223 of the first embodiment and the explanation thereof is omitted.

In the second embodiment, if the power supply voltage Vcc is not high enough to conduct the image stabilizing operation when the image stabilizing operation is selected by the selection switch ISSW, the photographing mode without the image stabilizing operation is automatically selected so long as the power supply voltage is high enough to permit the normal photographing without the image stabilizing operation.

FIG. 4 shows a flow chart of a third embodiment of the operation of FIG. 1.

Steps 400 to 405 are identical to the steps 200 to 204 and 206 of the first embodiment. In a step 406, the flag BCNG2L which latches the output BCNG2 of the comparator 131 is reset to the L level. In a step 407, the status of the output BCNG2 is checked. If it is at the H level, BCNG2L is set to the H level.

Steps 409 to 420 are identical to the steps 205 and 212 to 219 of the first embodiment, and the explanation thereof is omitted.

In a step 421, the status of ISONL is checked. If it is at the L level, the process proceeds to a step 425 where the output $\overline{\text{ISCONT}}$ is rendered to the H level so that no image stabilizing operation is conducted. If ISONL is at the H level in the step 421, the status of BCNG2L is checked in a step 422. If it is at the L level, the process immediately proceeds to a step 424 to render the output $\overline{\text{ISCONT}}$ to the L level to immediately start the image stabilizing operation. If BCNG2L is at the H level, the status of the output HCNT of the window comparator is checked in a step 423. When the output of the swing displacement detection means (the output of the operational amplifier 16) is not within the predetermined level range $+VC \sim -VC$, the output HCNT is at the L level and the process remains in the step 423. If it is within the range $+VC \sim -VC$, the output HCNT is at the H level and the process immediately proceeds to a step 424 to start the image stabilizing operation. In a step 426, $\overline{\text{PLON}}$ is rendered to the L level to start the drive of the body tube and the opening of the shutter.

In the third embodiment, the selection switch ISSW selects the image stabilizing operation, but when the power supply voltage Vcc is not high enough to conduct the image stabilizing operation, the image stabilizing operation is started when the output of the swing displacement detection means reaches substantially center and the shutter is immediately opened. In this manner, the photographing is performed while the energization to the voice coil 98 for the image stabilizing operation is minimized.

In accordance with the above embodiments, the battery check level to assure the operation during the shutter control of the camera is varied depending on the status of the selection switch ISSW, which selects the image stabilizing operation during the opening of the shutter, so that the camera with the image stabilizer which is optimally adapted to the photographing condition, is provided.

Instead of varying the battery check level, the battery check level may be kept constant but a load to check the battery may be varied. For example, a potentiometer may be used as the resistor 132 so that the resistance thereof is varied in accordance with the status of the selection switch ISSW in such a manner that a larger load is applied when the image stabilizing operation is to be effected. Also a combination of these approaches may also be used to attain the same effect as that of the above embodiments.

The determination as to whether the image stabilizing operation is to be conducted or not may be automatically done by the output of the swing displacement detection means or the shutter speed, instead of by the selection switch ISSW.

The present invention is not limited to the above embodiments and any types of swing detection means and swing correction means may be used in the present invention.

What is claimed is:

1. A camera with an image stabilizing device comprising:
    (A) a power supply for the camera;
    (B) image stabilizing means energized by the power supply of the camera for stabilizing an image of the camera;
    (C) discrimination means for discriminating a status of the power supply; and
    (D) control means for varying a manner of discrimination by the discrimination means in accordance with the status of the image stabilizing means.

2. A camera according to claim 1 wherein the power supply of the camera includes a battery.

3. A camera according to claim 1 wherein the power supply of the camera energizes an exposure device.

4. A camera according to claim 1 wherein the power supply of the camera energizes a shutter.

5. A camera according to claim 1 wherein the image stabilizing means includes a mechanical operating element.

6. A camera according to claim 1 wherein the control means includes means for varying a discrimination level of the discrimination means.

7. A camera according to claim 6 wherein the control means includes means for varying the discrimination level of the discrimination means toward a stricter level when the image stabilizing means is to be operated.

8. A camera according to claim 1 wherein the control means includes means for varying a discrimination load of the discrimination means.

9. A camera according to claim 8 wherein control means includes means for increasing the discrimination load of the discrimination means when the image stabilizing means is to be operated.

10. A camera according to claim 1 wherein the discrimination means includes means for discriminating a voltage status of the power supply.

11. A camera according to claim 1 wherein the control means includes discrimination means for discriminating whether the image stabilizing means is to be operated or not.

12. A camera according to claim 11 wherein the discrimination means includes means for discriminating a status of a switch to be set when the image stabilizing means is to be operated.

13. A camera according to claim 1 further comprising:
inhibit means for inhibiting an exposure operation in response, to the discrimination by the discrimination means that the status of the power supply is improper.

14. A camera according to claim 1 further comprising:
inhibit means for inhibiting the operation of the image stabilizing means in response to the discrimination by the discrimination means that the status of the power supply is improper when the image stabilizing means is to be operated.

15. A camera according to claim 1 further comprising:
means for inhibiting the operation of the image stabilizing means and effecting the photographing in response to the discrimination by the discrimination means that the status of the power supply is improper when the image stabilizing means is to be operated.

16. A camera according to claim 1 further comprising:
regulation means for regulating the operation of the image stabilizing means in response to the discrimination by the discrimination means that the status of the power supply is improper.

17. A camera according to claim 16 wherein the regulation means includes means for permitting the operation of the image stabilizing means when the swing status is below a predetermined level.

18. A camera according to claim 16 wherein the regulation means includes means for operating the image stabilizing means and conducting the photographing when the swing status is below a predetermined level.

19. An image stabilizing device for a camera comprising:

(A) image stabilizing means energized by a power supply of the camera for stabilizing an image viewed by the camera;
(B) discrimination means for discriminating a status of the power supply; and
(C) control means for varying a manner of discrimination by the discrimination means in accordance with the status of the image stabilizing means.

20. An image stabilizing device for a camera according to claim 19 wherein the power supply of the camera includes a battery.

21. An image stabilizing device for a camera according to claim 19 wherein the power supply of the camera energizes an exposure device.

22. An image stabilizing device for a camera according to claim 19 wherein the power supply of the camera energizes a shutter.

23. An image stabilizing device for a camera according to claim 19 wherein the image stabilizing means includes a mechanical operating element.

24. An image stabilizing device for a camera according to claim 19 wherein the control means includes means for varying a discrimination level of the discrimination means.

25. An image stabilizing device for a camera according to claim 24 wherein the control means includes means for varying the discrimination level of the discrimination means toward a stricter level when the image stabilizing means is to be operated.

26. An image stabilizing device for a camera according to claim 19 wherein the control means includes means for varying a discrimination load of the discrimination means.

27. An image stabilizing device for a camera according to claim 26 wherein control means includes means for increasing the discrimination load of the discrimination means when the image stabilizing means is to be operated.

28. An image stabilizing device for a camera according to claim 19 wherein the discrimination means includes means for discriminating a voltage status of the power supply.

29. An image stabilizing device for a camera according to claim 19 wherein the control means includes discrimination means for discriminating whether the image stabilizing means is to be operated or not.

30. An image stabilizing device for a camera according to claim 29 wherein the discrimination means includes means for discriminating a status of a switch to be set when the image stabilizing means is to be operated.

31. An image stabilizing device for a camera according to claim 19 further comprising:
inhibit means for inhibiting an exposure operation in response to the discrimination by the discrimination means that the status of the power supply is improper.

32. An image stabilizing device for a camera according to claim 19 further comprising:
inhibit means for inhibiting the operation of the image stabilizing means in response to the discrimination by the discrimination means that the status of the power supply is improper when the image stabilizing means is to be operated.

33. An image stabilizing device for a camera according to claim 19 further comprising:
means for inhibiting the operation of the image stabilizing means and effecting the photographing in response to the discrimination by the discrimination means that the status of the power supply is improper when the image stabilizing means is to be operated.

34. An image stabilizing device for a camera according to claim 19 further comprising:
regulation means for regulating the operation of the image stabilizing means in response to the discrimination by the discrimination means that the status of the power supply is improper.

35. An image stabilizing device for a camera according to claim 34 wherein the regulation means includes means for permitting the operation of the image stabilizing means when the swing status is below a predetermined level.

36. An image stabilizing device for a camera according to claim 34 wherein the regulation means includes means for operating the image stabilizing means and conducting the photographing when the swing status is below a predetermined level.

* * * * *

UNITED STATES PATENT AND TRADEMARK OFFICE
CERTIFICATE OF CORRECTION

PATENT NO. : 5,175,580

DATED : December 29, 1992

INVENTOR(S) : Yasuhiko SHIOMI

It is certified that error appears in the above-identified patent and that said Letters Patent is hereby corrected as shown below:

AT [57] ABSTRACT:

line 2, "comprises" should be deleted.

COLUMN 1:

line 15, "systems," should read --system--; and
line 54, "drawbacks above of the above, drawbacks" should read --light of the above drawbacks,--.

COLUMN 2:

line 27, "tube 2" should read --tube 2,--;
line 30, "to relative" should read --relative to--;
line 36, "Specifically" should read --Specifically,--; and
line 67, "moves" should read --moves.-- and "are respectfully" should read --are amplified, respectively,--.

COLUMN 4:

line 52, "Steps" should read --Steps 208--.

UNITED STATES PATENT AND TRADEMARK OFFICE
CERTIFICATE OF CORRECTION

PATENT NO. : 5,175,580

DATED : December 29, 1992

INVENTOR(S) : Yasuhiko SHIOMI

It is certified that error appears in the above-identified patent and that said Letters Patent is hereby corrected as shown below:

<u>COLUMN 7</u>:

line 34, "response," should read --response--.

Signed and Sealed this

Seventh Day of December, 1993

BRUCE LEHMAN

Attest:

Attesting Officer

Commissioner of Patents and Trademarks